(12) United States Patent
Laska et al.

(10) Patent No.: US 7,709,938 B2
(45) Date of Patent: May 4, 2010

(54) ARRANGEMENT FOR ELECTRICALLY CONNECTING SEMICONDUCTOR CIRCUIT ARRANGEMENTS TO AN EXTERNAL CONTACT DEVICE AND METHOD FOR PRODUCING THE SAME

(75) Inventors: Thomas Laska, München (DE);
Matthias Stecher, München (DE);
Gregory Bellynck, Donaustauf (DE);
Khalil Hosseini, Weihmichl (DE);
Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 668 days.

(21) Appl. No.: 11/472,653

(22) Filed: Jun. 22, 2006

(65) Prior Publication Data

US 2007/0001283 A1    Jan. 4, 2007

(30) Foreign Application Priority Data

Jun. 22, 2005    (DE) .................. 10 2005 028 951

(51) Int. Cl.
*H01L 23/495* (2006.01)
(52) U.S. Cl. ...................... 257/677; 257/784
(58) Field of Classification Search ................. 257/677, 257/784, 666
See application file for complete search history.

(56) References Cited

U.S. PATENT DOCUMENTS

| | | | | |
|---|---|---|---|---|
| 3,864,728 A | * | 2/1975 | Peltz et al. .................. 257/677 |
| 4,000,842 A | * | 1/1977 | Burns .................... 228/180.21 |
| 4,736,236 A | * | 4/1988 | Butt ............................ 257/672 |
| 6,255,723 B1 | * | 7/2001 | Light et al. .................. 257/677 |
| 6,512,304 B2 | * | 1/2003 | Ewer .......................... 257/779 |
| 6,825,564 B2 | | 11/2004 | Gleason et al. |
| 7,061,949 B1 | * | 6/2006 | Zhou et al. .................... 372/36 |
| 7,468,560 B2 | * | 12/2008 | Guengerich et al. ......... 257/784 |
| 2003/0102563 A1 | | 6/2003 | Mercado et al. |
| 2004/0217488 A1 | | 11/2004 | Luechinger |

FOREIGN PATENT DOCUMENTS

| | | |
|---|---|---|
| DE | 69912565 T2 | 9/2004 |
| GB | 2362510 A | 11/2001 |
| JP | 55078536 A | 6/1980 |
| JP | 62219628 | 9/1987 |
| JP | 63300522 A | 7/1988 |
| JP | 02094452 | 4/1990 |
| JP | 06302639 | 10/1994 |
| JP | 11037022 | 2/1999 |
| JP | 2002222826 A | 8/2002 |
| JP | 2003173659 A | 6/2003 |

\* cited by examiner

*Primary Examiner*—S. V Clark
(74) *Attorney, Agent, or Firm*—Dicke, Billig & Czaja, PLLC

(57) ABSTRACT

An electrical connection arrangement between a semiconductor circuit arrangement and an external contact device, and to a method for producing the connection arrangement is disclosed. In one embodiment, a metallic layer is deposited onto at least one contact terminal and/or the contacts and the wire, the metallic layer protecting the contact terminal or the electrical connection against ambient influences and ensuring a high reliability.

5 Claims, 5 Drawing Sheets

ARRANGEMENT FOR ELECTRICALLY CONNECTING SEMICONDUCTOR CIRCUIT ARRANGEMENTS TO AN EXTERNAL CONTACT DEVICE AND METHOD FOR PRODUCING THE SAME

CROSS-REFERENCE TO RELATED APPLICATIONS

This Utility Patent Application claims priority to German Patent Application No. DE 10 2005 028 951.7 filed on Jun. 22, 2005, which is incorporated herein by reference.

FIELD OF THE INVENTION

The invention relates to an electrical connection arrangement between a semiconductor circuit arrangement and an external contact device, and to a method for producing a connection arrangement.

BACKGROUND

In the production of modules containing integrated circuits, or surface-mountable components (SMD), usually the circuits and components are first produced on or in semiconductor wafers by means of microelectronic technologies and circuit arrangements are thus formed, contact terminals for electrical connection to an external contact device being applied on the surface of the semiconductor circuit arrangement. The semiconductor circuit arrangements or semiconductor chips are then singulated, connected to external contact devices and enclosed by a housing. Within this process, the semiconductor circuit arrangements are electrically characterized and mounted on a carrier and the electrical connection to external terminals is produced.

Contact terminals on the surface of semiconductor circuit arrangements are subjected to various ambient influences during the processing, the electrical characterization of the components and circuits contained and the subsequent production of the electrical connection to an external contact device. Thus, by way of example, as a result of needle card compressions during the measuring operation or as a result of the bonding, cracks may arise in the metallization of the contact terminal, the cracks promoting diffusion of alkali metal ions, e.g. Na ions, into the semiconductor circuit arrangement, specifically into the active areas, and thus leading for example to a shift in the threshold voltage of transistors.

The electrical connections between a semiconductor circuit arrangement and an external contact device can be implemented in various ways. One very widespread method is wire bonding using an Au or Al wire. In this case, a first end of the wire is fixed on the internal contact terminal on the surface of the semiconductor circuit arrangement, the wire is subsequently led from there to an external contact terminal on the surface of the external contact device and the second end of the wire is fixed on the external contact terminal.

Various methods which differ with regard to the materials used and the process parameters used, such as e.g. pressure and temperature, are customary in the case of wire bonding. Thermocompression bonding involves using an Au wire, the end of which is melted and pressed onto the contact terminal. Ultrasonic bonding involves fixing an Al wire, for example, on the contact terminal by means of a cold welding compression connection, that is to say at room temperature with application of ultrasound. A combination of both methods is also possible.

Producing the electrical connection by means of bonding entails some serious problems. During bonding on the surface of the semiconductor circuit arrangement, it is possible, primarily in the case of process parameters which lead to a great deformation of the bond (overbonding), for cracks to occur in the contact metallization, the cracks promoting diffusion of alkali metal ends, e.g. Na ions, into the active regions of the semiconductor circuit arrangement and thus leading to an alteration of the electrical properties of the semiconductor circuit arrangement. The bonding yield and the reliability of the bonding connections, e.g. the power cycling strength, are dependent on the process parameters chosen. Thus, a low pressure during the production of the bonding connection may increase the yield, but it simultaneously reduces the reliability, whereas although an increased pressure during the production of the bonding connection and thus an enlarged bearing area of the wire on the contact terminal increase the reliability, they nonetheless lead for example to the above-mentioned problems with cracks in the metallization.

This problem is relevant particularly when using thick wires such as are employed in the bonding of power semiconductor modules on account of the high current-carrying capacity acquired.

Furthermore, corrosive molding compound materials may attack the bonding contact, which reduces the strength and reliability of the contact. These materials are part of the housing which encloses the semiconductor circuit arrangement and the external contact device. Furthermore, portions of the bonding contact are observed to be etched away from the contact terminal during subsequent processes on account of different chemical potentials.

In order to solve these problems, complicated optimization processes have been carried out hitherto for the electrical characterization by means of needle cards and for the bonding parameters, but although they have brought about an improvement, they do not constitute a final solution to the problem. Furthermore, the metallization on the surface of the semiconductor circuit arrangement has been embodied as a very thick layer or mechanically hardened by the targeted admixture of additional materials in order that process parameters which enable a high yield and reliability can be used during bonding. For mechanical stabilization of the bonding contact on the surface of the semiconductor circuit arrangement, which is necessary particularly in the case of bonding processes without great deformation of the bonding wire, and also protection against aggressive molding compound materials, a hard, high-temperature-resistant plastic is applied to the bonding contact. However, all these solution approaches lead to a significant increase in costs. There is currently no solution for the problem of the bonding contact being etched away on account of different chemical potentials.

U.S. Pat. No. 6,825,564 discloses a method in which an NiP layer was deposited in electroless fashion on a contact terminal made of Cu in order to prevent the oxidation of the Cu surface and thus to improve the bondability of the contact terminal.

U.S. Pat. No. 6,564,449 describes a method for reinforcing the contact terminal on the surface of the semiconductor circuit arrangement, in which an additional layer system made of Ti, Cr or TiW and Au or made of Ni and Au is deposited on the contact terminal in order to increase the reliability and reproducibility of the bonding contact in the case of reverse wire bonding using Au wire.

DE 26 50 348 A1 describes a connection arrangement in which a layer system comprising an Ni layer and an Au layer was applied to the pin-type electrical connecting conductors of a discrete electrical component and to the conductor track to be connected thereto on a printed circuit board, in order to improve the solderability of the contact terminals.

A use of Cu as material for the wire is envisaged in the future on account of the good electrical properties of Cu. This is not yet possible at the present time, however, since high forces are necessary when producing the contact between the Cu wire and the contact terminal, which, in the case of the present-day embodiment of the contact terminals on the surface of the semiconductor circuit arrangement, leads to damage in the contact terminal and the underlying regions of the semiconductor circuit arrangement.

For these and other reasons, there is a need for the present invention.

SUMMARY

The present invention provides an electrical connection arrangement between a semiconductor circuit arrangement and an external contact device, and to a method for producing the connection arrangement. In one embodiment, a metallic layer is deposited onto at least one contact terminal and/or the contacts and the wire, the metallic layer protecting the contact terminal or the electrical connection against ambient influences and ensuring a high reliability.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
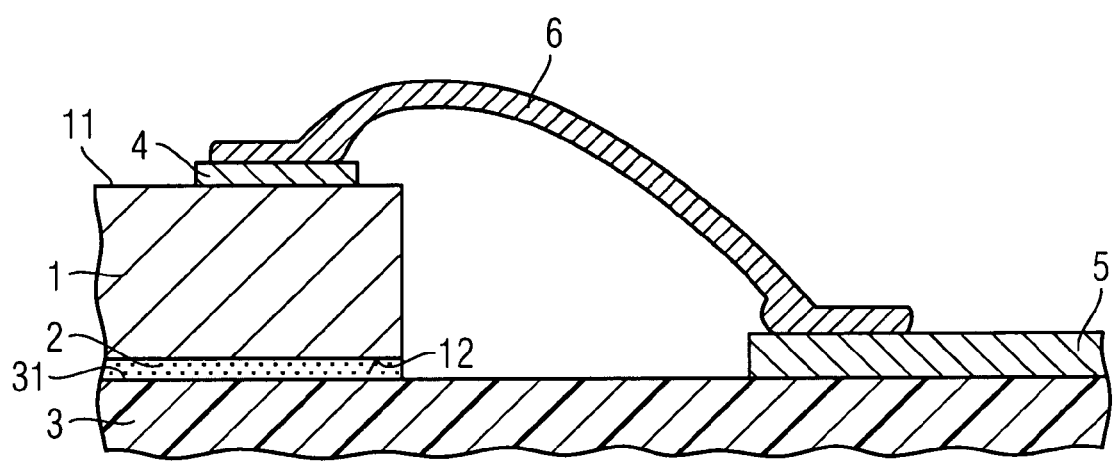
FIG. 1 illustrates a schematic illustration of a conventional connection arrangement.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a connection arrangement between a semiconductor circuit arrangement and an external contact device, in which a wire is used to produce the electrical connection between an internal contact terminal on the surface of the semiconductor circuit arrangement and an external contact terminal on the surface of the external contact device, which connection arrangement is resistant to ambient influences, ensures a stable, reliable electrical connection in conjunction with a high process yield and makes it possible to use Cu as material for the wire. Furthermore, the invention provides a method for producing such a connection arrangement.

In one embodiment of a connection arrangement of the type according to the invention, an additional metallic layer is applied on at least the internal contact terminal and on the wire or on the surface of at least one contact terminal connected to the wire and the wire or on both contact terminals. In a further connection arrangement of the type according to the invention, an additional metallic layer is applied only on the internal contact terminal, the diameter of the wire being at least 500 µm or the wire comprising Cu. The diameter of the Cu wire is at least 50 µm for a thin wire and at least 300 µm for a thick wire.

The metallic layer protects the contact terminal against ambient influences during the electrical characterization and the further processing, in particular by virtue of the fact that cracks in the metallization that promote the diffusion of alkali metal ions are avoided or covered and, if appropriate, oxidation of the metallization surface is prevented. Furthermore, the metallic layer makes it possible to use Cu as material for the wire and particularly favorable process parameters during the production of the electrical connection by means of a wire, mechanically stabilizes the electrical connection and makes it resistant to chemical processes.

The connection arrangement according to the invention provides the high yield of the bonding process on account of the favorable process parameters that are possible and the high reliability of the electrical connection, particular requirements made of the metallization on the surface of the semiconductor circuit arrangement, such as e.g. mechanical hardness and/or large thickness, being obviated when using thick Al or Au wires (diameter of at least 500 µm). Failures of the electrical connection which result from fractures within the wire close to the bonding contact such as occur in the case of bond coating with a plastic are also avoided. The metallic layer additionally acts as a protective layer against etching and diffusion processes during further processing and during later use of the module containing a connection arrangement. When the metallic layer is deposited on the wire, it prevents the corrosion of the wire and thus increases the reliability.

Furthermore, the present invention provides for the application of such a metallic layer to other connection arrangements, too, in which the electrical contact has been produced in a different manner, e.g. by soldering.

The metallic layer includes arbitrary Ni compounds, in particular NiP, NiB, NiMo, NiRe or tertiary material compositions NiPX, where X comprises Cu, W, Sn, Mo or Sb. In this context, the designation NiY or NiPX denotes an Ni—Y or NiP—X alloy, respectively, that is to say elemental Ni with an admixture of Y or P and X, respectively. As an alternative, the metallic layer comprises Cu, Ag, Sn, SnAg or Au. The layer has a thickness of 0.1 to 100 µm, a typical thickness between 1 to 5 µm. Advantages of NiP, NiB, NiMo, NiRe and the tertiary material compositions mentioned are the great hardness and the possibility of being able to deposit these metals by means of an electroless method. The phosphorous content of 5 to 10% in NiP or the boron content of 1 to 5% in NiB prevents the oxidation of the surface of the Ni layer. A further layer may be applied to the metallic layer, which further layer comprises Pd or Au and passivates the metallic layer and makes it chemically resistant and is advantageous for further processes. By way of example, it prevents the oxidation of the surface of the metallic layer and improves the bondability. Furthermore, a uniform coating of the connection arrangement with a noble metal is advantageous with regard to further processes and the reliability of the connection arrangement. The layer comprising Pd or Au is thin in comparison with the metallic layer, with a thickness of a few hundred nm.

The metallic layer or the layer system may be adapted to the requirements and conditions of the semiconductor circuit arrangement and of the external contact device and also of the process for producing the electrical connection, in particular with regard to the materials used and the process parameters of the deposition.

In one embodiment, it is additionally possible to effect further mechanical stabilization of the electrical connection and protection of the bonding contact against attack by molding compound materials by the application of a hard, high-temperature-resistant plastic to the bonding contact.

In one method according to the invention, the metallic layer is applied after producing the electrical connection between the semiconductor circuit arrangement and the external contact device and thus envelops at least one of the contact terminals connected to the wire and also the wire itself.

In another embodiment of the method according to the invention, the metallic layer is deposited prior to producing the electrical connection to the external contact device. This may be done both in the wafer assembly and on the already singulated semiconductor circuit arrangement, so that the metallic layer is situated only on the internal contact terminal. If the metallic layer is not deposited until after the semiconductor circuit arrangement has been mounted on a carrier that also contains the external contact device, then it is situated both on the internal contact terminal and on the external contact terminal.

In a further embodiment, the metallic layer is deposited for the first time as described above prior to producing the electrical connection and is then deposited again after producing the electrical connection. It is thus situated on at least the internal contact terminal and envelops at least one of the contact terminals connected to the wire and also the wire itself.

Further embodiments of the present invention are formed by combinations of the embodiments described above.

Another embodiment of the connection arrangement according to the invention provides an additional layer made of hard, high-temperature-resistant plastic above the internal contact terminal connected to the wire, which additional layer is applied in a particular embodiment of the method according to the invention and brings about additional mechanical stabilization of the contact.

Power semiconductor modules such as IGBT modules, for example, are provided in a particular manner for the semiconductor circuit arrangement, but the selection is not restricted thereto.

Various carrier substrates, multichip modules, housing forms and also other semiconductor circuit arrangements (chip-to-chip bonding) may be used as external contact device.

By way of example, Al and Au wires and in a particular embodiment Cu wires, too, may be used as wire for producing the electrical connection between the semiconductor circuit arrangement and the external contact device. However, other materials are also possible. The wire 6 may in this case have a round or polygonal cross section. Therefore, a "wire" is to be understood for example also to mean a strip or the like.

The metallic layer may be deposited in electroless fashion or in an electrodeposition process. For electroless coating, it is necessary firstly to wet the surface with wetting seeds that settle on all the exposed metallic surfaces. The metallic layer made of NiP or NiB is then deposited in electroless fashion at the locations where the wetting took place. No layer is deposited on nonmetallic surfaces, such as, for example, the passivation of the semiconductor circuit arrangement. Furthermore, a passivation layer comprising Pd or Au may be deposited on the metallic layer.

When an electrodeposition process is used, wetting is obviated since there is no need to seed the surface to be coated. In this case, the metallic layer is deposited only on metallic surfaces which have a specific electrical potential. Further advantages are the possibility of depositing other metals as well, such as e.g. Cu, Sn, SnAg, Ag and Au, and of obtaining higher deposition rates in the process. Since this deposition is effected with current flow, it is important that there is an electrical connection between the semiconductor circuit arrangement and the external contact device.

A method for producing the metallic layer according to the invention is simple and easy to integrate into the process for producing the semiconductor circuit arrangement at the wafer level or into the overall mounting process of the semiconductor circuit arrangement and thus replaces costly or complicated alternative methods such as, for example, stabilization of the bonding contact with a plastic coating or optimization of the metallization on the surface of the semiconductor circuit arrangement and the parameters of the bonding process.

FIG. 1 illustrates a conventional connection arrangement. A semiconductor circuit arrangement 1 has a top side 11 and an underside 12. An external contact device 3 has a top side 31. The semiconductor circuit arrangement 1 is fixed on the external contact device 3 by means of a connecting layer 2 in such a way that the underside 12 of the semiconductor circuit arrangement 1 and the top side 31 of the external contact device 3 are opposite one another. An internal contact terminal 4 is situated on the surface of the top side 11 of the semiconductor circuit arrangement 1, and an external contact terminal 5 is arranged on the surface of the top side 31 of the external contact device 3. In this case, that region of the external contact device 3 which is situated below the semiconductor circuit arrangement 1 and that region of the external contact device 3 on which the external contact device 5 is situated are electrically insulated from one another and may even be mechanically separated from one another. The electrical connection between the internal contact terminal 4 and the external contact terminal 5 is produced by means of a wire 6 made, for example, of Al or Au or Cu. The wire 6 may be connected to the contact terminals 4 and 5 by means of a wedge-wedge or ball-wedge method.

FIG. 2 then illustrates a connection arrangement according to the invention. In FIG. 2A, a metallic layer 7 envelops the still exposed surfaces of the internal and external contact terminals 4 and 5 connected to the wire 6 and also the wire 6.

Figure 2A:
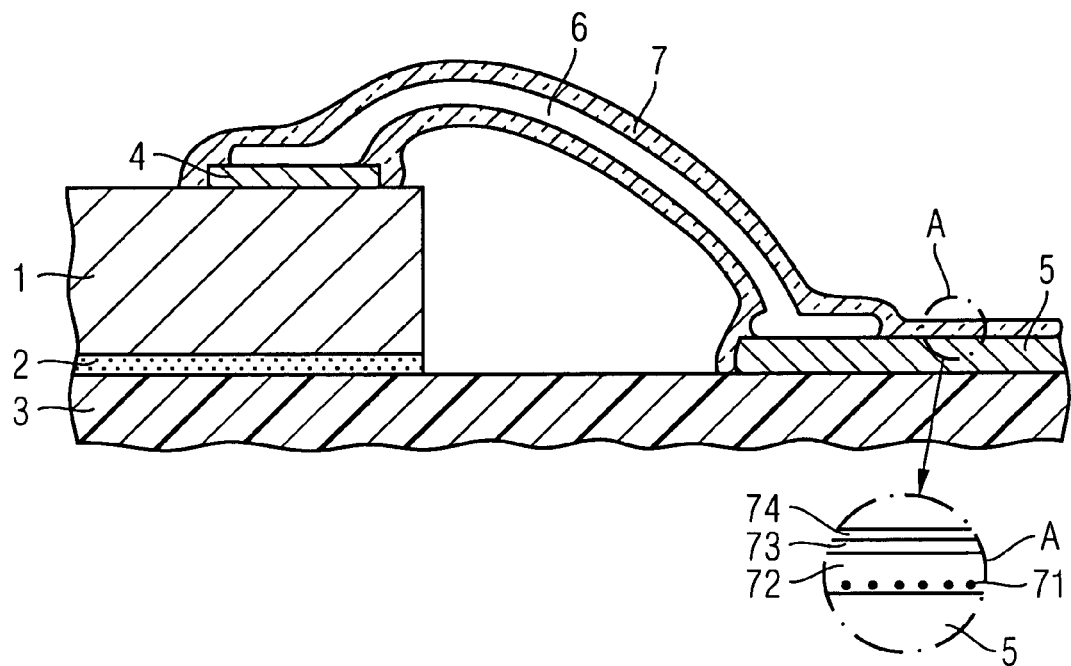
FIGS. 2A to 2D illustrate schematic illustrations of a connection arrangement in accordance with the present invention in particularly preferred embodiments in each case.

The layer 7 comprises for example Zn seeds 71, an Ni alloy layer 72, in particular NiP or NiB, and optionally a Pd layer 73 and/or an Au layer 74 (cf. detail A in FIG. 2A). In other words: the layer 7 may for example comprise an Ni alloy layer 72, an Ni alloy layer 72 and a Pd layer 73, an Ni alloy layer 72 and an Au layer 74 or an Ni alloy layer 72, a Pd layer 73 and an Au layer 74.

Figure 2B:
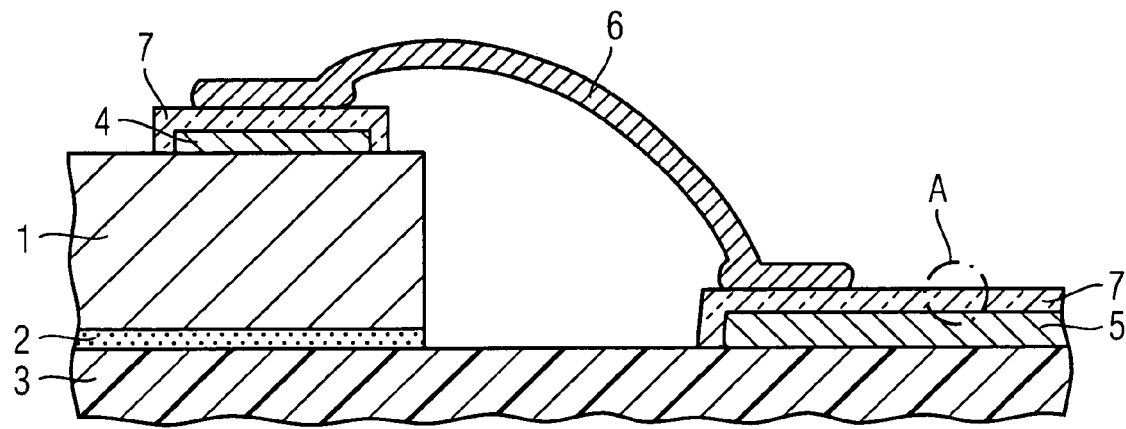

In FIG. 2B, the metallic layer 7 is applied on the internal and the external contact terminal 4 and 5. In another embodiment (not illustrated), the metallic layer 7 is applied only on the internal contact terminal 4, the wire 6 having a diameter of at least 500 µm or comprising Cu.

Figure 2C:
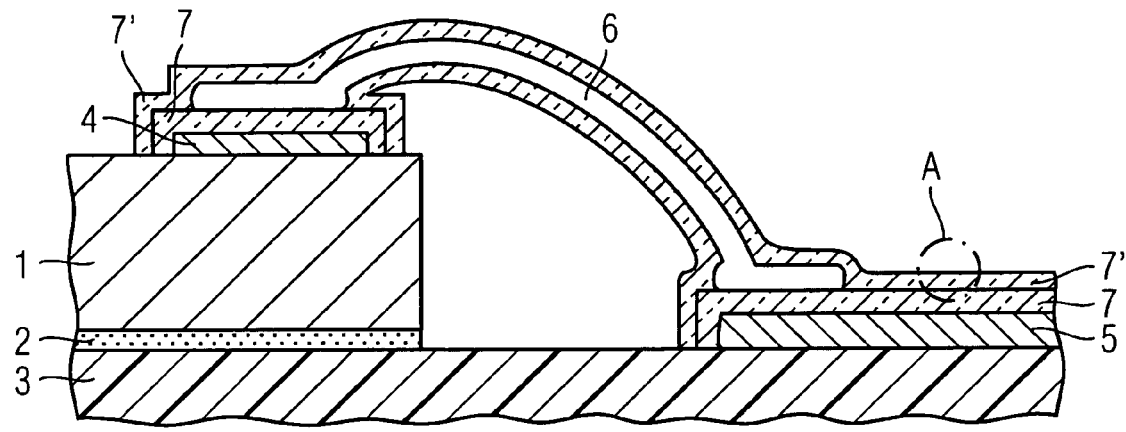

The metallic layer 7 may, however, also be applied on the internal and external contact terminals 4 and 5 and additionally on the still exposed surfaces of the internal and external contact terminals 4 and 5 connected to the wire 6 and also on the wire 6, as illustrated in FIG. 2A. Such connection arrangement is illustrated in FIG. 2C, the second metallic layer being designated by 7' and being identical in construction to the first metallic layer 7. It is likewise possible (but not illustrated here) for the metallic layer 7 to be situated on the internal contact terminal 4 and additionally on the still exposed surfaces of the internal and external contact terminals 4 and 5 connected to the wire 6 and also on the wire 6, as illustrated in FIG. 2A.

Figure 2D:
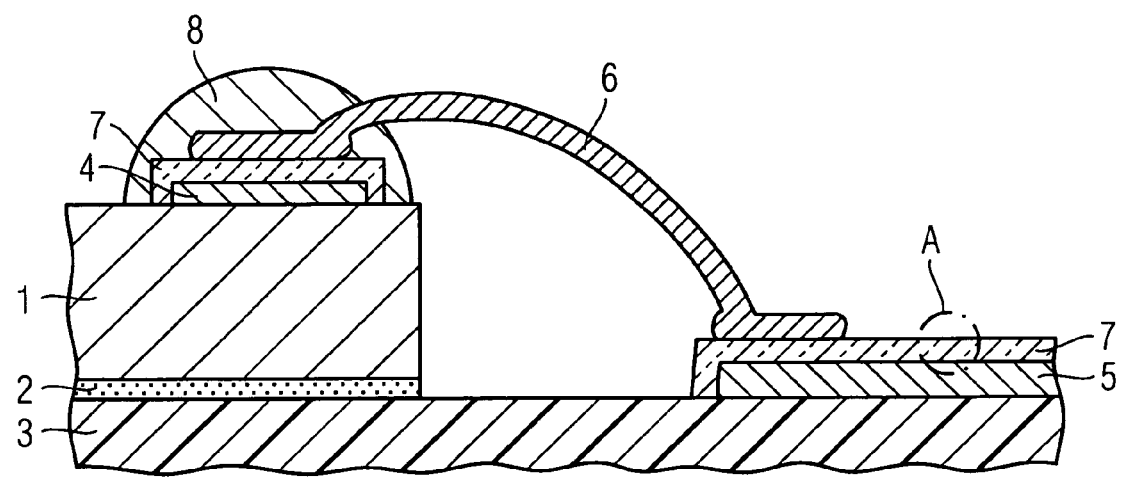

A further embodiment is illustrated in FIG. 2D, where the metallic layer 7 is situated on the internal and external contact terminals 4 and 5 as in the exemplary embodiment of FIG. 2B and an additional layer 8 made of hard, high-temperature-resistant (Tmelting>200° C.) plastic is also applied on the internal contact terminal 4 connected to the wire 6. In a further embodiment (not illustrated here), the metallic layer 7 is applied only on the internal contact terminal 4 and the internal contact terminal 4 connected to the wire is additionally enveloped with a layer 8 made of a plastic described above.

FIG. 3 schematically illustrates method sequences for producing the connection arrangements illustrated in FIG. 2. A process 41 involves applying the metallic layer 7 and a process 42 involves forming the electrical connection between the semiconductor circuit arrangement 1 and the external contact device 3 by means of the wire 6.

When an electroless deposition method is used, process 41 is subdivided into the following subprocesses:

A Immersion in a wetting bath and deposition of seeds on all the exposed metal surfaces, B Immersion in a bath comprising an Ni alloy and deposition of an Ni alloy layer, in particular NiP or NiB, and optionally C Immersion in a Pd and/or Au bath and deposition of a Pd layer or an Au layer or a Pd layer and an Au layer.

The wetting bath generally contains Zn, which serves as a seed for the Ni alloy deposition, in particular NiP or NiB. If the metallization of the contact terminals comprises Nu, then Pd serves as a seed for the later NiP or NiB deposition. The thickness of the deposited NiP or NiB layer lies in the range of 0.1 to 100 µm, a typical thickness being 1 to 5 µm. The phosphorus content in NiP is typically 5 to 10% and the boron content in NiB is typically 1 to 5%. The optional layer made of Pd or Au or the layer system made of Pd and Au is thin in comparison with the NiP or NiB layer. The thickness of the Pd or the Au layer is typically 20 to 400 nm and the thickness of an additional Au layer on a Pd layer is typically 40 to 80 nm. The optional layer or the layer system passivates the surface of the NiP or NiB layer, prevents the oxidation thereof and improves the bondability.

The layer 7 thus comprises for example Zn seeds 72, an Ni alloy layer 72 and optionally a Pd layer 73 and/or an Au layer 74 (cf. detail A in FIG. 2A).

The deposition of the metallic layer may be carried out after the singulation of the semiconductor circuit arrangement and mounting on the external contact device and also prior to singulation in the wafer assembly.

When an electrodeposition process is used in process 41, subprocess A is obviated since there is no need to seed the surface to be coated. Further advantages are the possibility of depositing other metals as well, such as e.g. Cu, Sn, Ag, SnAg and Au, and of obtaining higher deposition rates in the process.

Process 42 comprises producing the electrical connection between the semiconductor circuit arrangement 1 and the external contact device 3 by means of the wire 6.

Figure 3A:
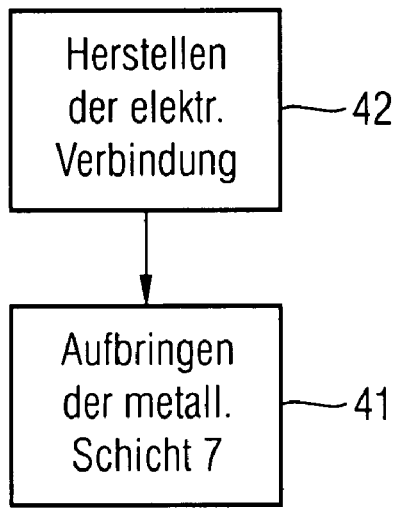
FIGS. 3A to 3D illustrate schematic illustrations of a method in accordance with the present invention in particularly preferred embodiments in each case, in flowcharts.

FIG. 3A illustrates a first embodiment of the method for producing a connection arrangement according to the invention, in which firstly the electrical connection is produced by means of the wire 6 and then the metallic layer 7 is applied. In this case, the process parameters may be chosen such that great deformation of the wire 6 on the internal contact terminal 4 does not occur, which increases the process yield and avoids damage in the metallization of the semiconductor circuit arrangement 1. The required reliability of the electrical connection is achieved by means of the additional metallic layer 7. A connection arrangement as illustrated in FIG. 2A is obtained as a result.

Figure 3B:
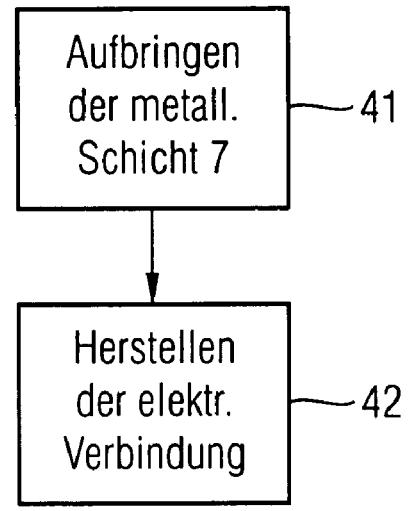

FIG. 3B illustrates a second embodiment of the method according to the invention for producing a connection arrangement, in which, after mounting the semiconductor circuit arrangement 1 on the external contact device 3, firstly the metallic layer 7 is applied and then the electrical connection is produced by means of the wire 6. In this case, the process parameters may be chosen such that a large bearing area of the wire 6 on the internal contact terminal 4 occurs, which increases the reliability without reducing the process yield and without causing damage in the metallization of the semiconductor circuit arrangement 1. A connection arrangement as illustrated in FIG. 2B is obtained as a result.

Figure 3C:
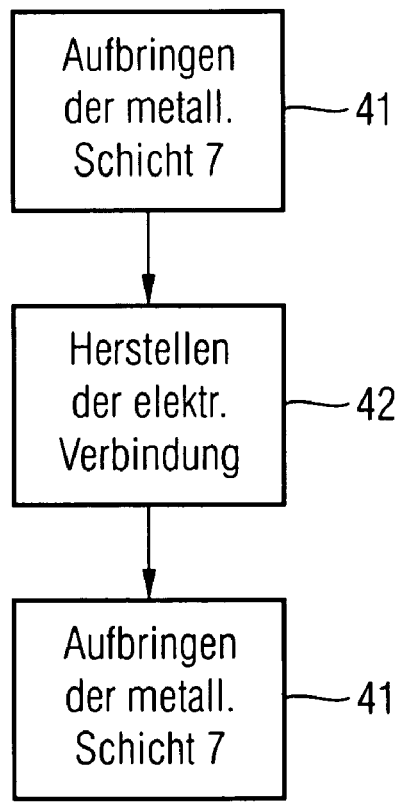

FIG. 3C illustrates a third embodiment of the method according to the invention for producing a connection arrangement, in which the metallic layer 7 is applied both prior to producing the electrical connection between the semiconductor circuit arrangement 1 and the external contact device 3 and afterward. In this case, the process parameters may be chosen such that a large bearing area of the wire 6 on the internal contact terminal 4 occurs, which increases the reliability without reducing the process yield and without causing damage in the metallization of the semiconductor circuit arrangement. The second metallic layer 7' on the contacts and the wire 6 itself stabilizes the electrical connection again and increases reliability further. A connection arrangement as illustrated in FIG. 2C is obtained as a result.

Figure 3D:
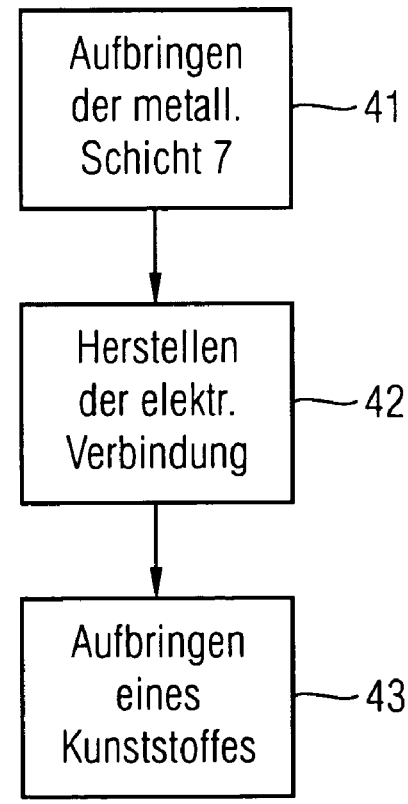

FIG. 3D illustrates a further embodiment, in which, after the process sequence as explained in the second embodiment, the electrical connection on the internal contact terminal 4 is mechanically stabilized by the application of the layer 8 made of hard, high-temperature-resistant plastic in the process 43 and the reliability is thus increased further. A connection arrangement as illustrated in FIG. 2D is obtained as a result.

Figure 4:
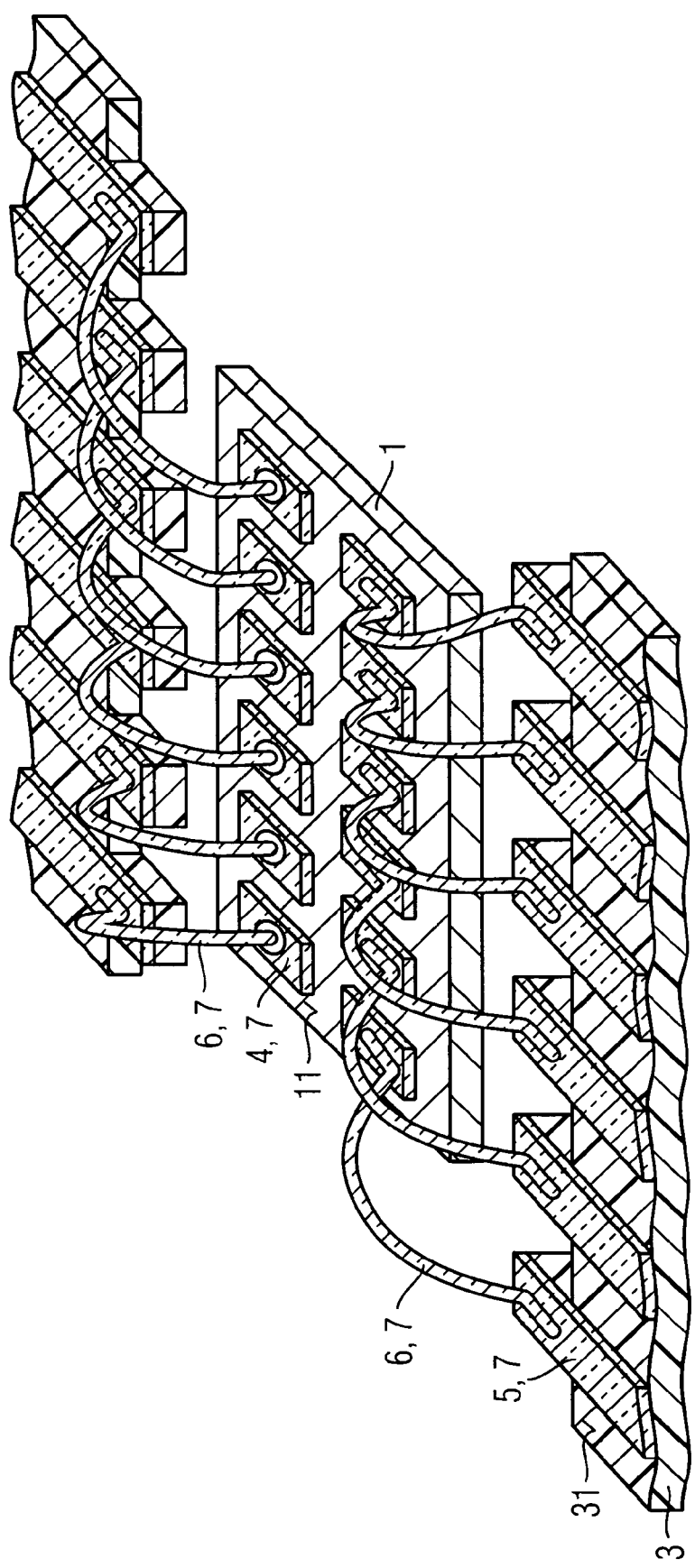
FIG. 4 illustrates a perspective illustration of a finished mounted semiconductor circuit arrangement using the connection arrangement according to the invention.

FIG. 4 illustrates a perspective illustration of a finished mounted semiconductor circuit arrangement 1 using the connection arrangement according to the invention. In this case, the internal contact terminals 4 on the top side 11 of the semiconductor circuit arrangement 1 are in each case connected to the external contact terminals 5 on the top side 31 of the external contact device 3 by means of a wire 6. In accordance with an exemplary embodiment of the connection arrangement according to the invention, an additional metallic layer 7 is situated on the surfaces of the contact terminals 4 and 5 that are still exposed after the production of the connection by means of wire 6, and also on the wires 6 (cf. FIG. 2A).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A connection arrangement between a semiconductor circuit arrangement and an external contact device, comprising:
   a semiconductor circuit arrangement having a top side and an underside opposite the top side;
   an external contact device having a top side;
   an electrical connection between an internal contact terminal on the top side of the semiconductor circuit arrangement and an external contact terminal on the top side of the external contact device comprises an electrically conductive wire;
   wherein a first metallic layer is arranged on a surface of the internal contact terminal and a second metallic layer is arranged on a surface of the wire, and the first and second metallic layers comprises a material selected from a group consisting of Cu or an arbitrary Ni compound, NiP, NiB, NiMo or NiRe, or tertiary material compositions NiPX, where X may be Cu, W, Sn, Mo or Sb.

2. The arrangement of claim 1, wherein an additional layer, which comprises Pd and/or Au is provided on the metallic layer.

3. The arrangement of claim 1, where an additional layer made of hard, high-temperature-resistant plastic is applied on the metallic layer above the internal contact terminal connected to the wire on the top side of the semiconductor circuit arrangement.

4. The arrangement of claim 1, wherein the wire comprises Al or Au.

5. The arrangement of claim 1, wherein the metallic layer is arranged on the surface of the external contact terminal.

* * * * *